US009018091B2

(12) United States Patent  (10) Patent No.: US 9,018,091 B2
Arnold et al.  (45) Date of Patent: Apr. 28, 2015

(54) METHODS FOR FORMING A SENSOR ARRAY PACKAGE

(71) Applicant: Apple Inc., Cupertino, CA (US)

(72) Inventors: Shawn X. Arnold, Santa Cruz, CA (US); Terry L. Gilton, Boise, ID (US); Matthew E. Last, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/252,596

(22) Filed: Apr. 14, 2014

(65) Prior Publication Data

US 2014/0227833 A1 Aug. 14, 2014

Related U.S. Application Data

(62) Division of application No. 13/632,145, filed on Sep. 30, 2012, now Pat. No. 8,736,080.

(60) Provisional application No. 61/640,589, filed on Apr. 30, 2012.

(51) Int. Cl.
*H01L 21/4763* (2006.01)
*G06K 9/00* (2006.01)
*H01L 23/00* (2006.01)
*H01L 29/06* (2006.01)
*H01L 23/24* (2006.01)

(52) U.S. Cl.
CPC ............ *H01L 24/85* (2013.01); *G06K 9/00053* (2013.01); *H01L 23/24* (2013.01); *H01L 24/11* (2013.01); *H01L 24/43* (2013.01); *H01L 24/81* (2013.01); *H01L 29/0657* (2013.01); *H01L 2224/48091* (2013.01); *H01L 2924/00* (2013.01); *H01L 2924/00014* (2013.01); *H01L 2924/10253* (2013.01)

(58) Field of Classification Search
CPC ............ H01L 2224/02; H01L 2224/10; H01L 2224/15; H01L 2224/13011; H01L 2224/13024; H01L 2224/13028
USPC ......... 257/621, 674–676, 686, 734–737, 781, 257/784, 786; 438/618–624, 637–638, 438/672–673
See application file for complete search history.

(56) References Cited

U.S. PATENT DOCUMENTS 5,472,886 A * 12/1995 Dautartas et al. ............... 438/29
5,731,222 A    3/1998 Malloy et al.
6,319,745 B1   11/2001 Bertin et al.
7,202,464 B2 * 4/2007 Hwang et al. ............. 250/214.1
7,674,701 B2   3/2010 Rinne

FOREIGN PATENT DOCUMENTS

JP      04247632       9/1992
TW      201142251      12/2011
WO      WO2011129307   10/2011

OTHER PUBLICATIONS

Taiwanese Patent Application No. 102114668—Office Action dated Oct. 29, 2014.

* cited by examiner

*Primary Examiner* — Dung A. Le
(74) *Attorney, Agent, or Firm* — Womble Carlyle Sandridge & Rice, LLP

(57) ABSTRACT

Various methods for forming a low profile assembly are described. The low profile assembly may include an integrated circuit. The integrated circuit as well as components associated with the integrated circuit may be positioned below a surface plane of a printed circuit board in which the integrated circuit is located. The integrated circuit may include bond wires configured to electrically connect the integrated circuits to other components. The low profile assembly may include forming various layers over a substrate and later removing some of the layers.

21 Claims, 15 Drawing Sheets

METHODS FOR FORMING A SENSOR ARRAY PACKAGE

CROSS-REFERENCE TO RELATED APPLICATION(S)

This is a divisional of U.S. application Ser. No. 13/632,145, filed Sep. 30, 2012, entitled "SENSOR ARRAY PACKAGE" by Arnold, et al., which claims the benefit of U.S. Provisional Patent Application No. 61/640,589, filed Apr. 30, 2012 entitled "SENSOR ARRAY PACKAGE" by Arnold, et al., which is incorporated by reference in its entirety for all purposes.

FIELD

The described embodiments relate generally to packaging for sensors, and more particularly, to a method for forming a low profile sensor.

BACKGROUND

Sensors and sensor arrays can be formed from customized integrated circuits. Sensor arrays are often used to sense environmental characteristics or can act as a user input for computing devices. Sensor arrays are often formed on a silicon wafer, using similar processing techniques to those used to fabricate other integrated circuits, such as memories, processors, field programmable gate arrays (FPGAs) and the like.

Sensors, unlike some general purpose integrated circuits, can have unique packaging and mounting requirements. Typical integrated circuits, for example, can have related silicon bonded out, and then packaged. The bonding out steps can couple signals on the silicon to pins or balls on the package. The packaging step can include encapsulating the silicon die in a package (typically plastic or ceramic). The packing can support and protect the otherwise fragile silicon die. However, since sensors are meant to interface with the environment, the packaging steps are often different.

Sensors are often outward facing, and generally exposed to a user environment. Instead of having the silicon die protected by a package, the die is often times exposed on the surface of a supporting element. While such configurations permit the sensor to function, these configurations can be bulky and can take up a relatively large amount of volume, increasing the size of a user device in which the sensor is ultimately used.

SUMMARY

One embodiment of a low profile sensor array assembly can include a sensor disposed on a first side of a substrate. Signal trenches can also be formed on the first side of the substrate and can be near sensor signal pads and extend to one edge of the substrate. A conductive layer can be deposited in the signal trench and couple to sensor signal pads. Bond wires can attach to the conductive layer and can couple signals from the sensor to external pads.

Another embodiment of a low profile sensor array assembly can include a sensor disposed on a first side of a substrate. The substrate can include a shaped feature on a first edge positioned near a signal pad of the sensor. The shaped feature can be configured to support a wire bond ball below a surface plane relative to the sensor. A conductive layer can be deposited on the substrate coupling the signal pad and the wire bond ball. A bond wire can be coupled to the wire bond ball and be arranged to remain below the surface plane relative to the sensor.

According to another embodiment of the invention, a low profile integrated circuit assembly includes at least one integrated circuit, a substrate including a first side, wherein the integrated circuit is disposed on the first side, at least one signal trench, formed on the first side of the substrate, proximate to an integrated circuit signal pad and extending to one edge of the substrate, a conductive layer disposed in the signal trench and coupling to the integrated circuit signal pad, and a bond wire configured to couple the conductive layer to an external pad wherein the bond wire, signal trench and conductive layer are maintained below a surface plane of the integrated circuit.

According to another embodiment of the invention, a low profile circuit assembly includes an integrated circuit, a substrate including a first side, wherein the integrated circuit is disposed on the first side, a shaped feature on a first edge of the substrate disposed proximate to an integrated circuit signal pad and arranged to support a wire bond ball below a surface plane of the integrated circuit, a conductive layer disposed on the first side of the substrate and configured to couple the integrated circuit signal pad to the wire bond ball, and a bond wire coupled to the wire bond ball and configured to remain below the surface plane of the integrated circuit.

According to another embodiment of the invention, a low profile assembly includes a first substrate, a second substrate, larger than the first substrate, wherein the first substrate is disposed on a first side of the second substrate, and at least one signal trench disposed on the first side of the second substrate and configured to support bond wire connections to the first substrate below a surface plane of the first substrate.

According to another embodiment of the invention, a method of forming a low profile assembly includes forming at least one signal trench in a substrate, depositing a barrier layer over the substrate proximate the at least one signal trench, depositing a seed layer of metal in the at least one signal trench, masking the substrate, barrier layer, and at least one signal trench, depositing additional metal over the masked substrate, and removing the mask and seed layer to form a final conductive layer in the at least one signal trench.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Sensors and sensor arrays are often fabricated on a silicon die and then supported with a structure underneath the die. To protect the surface of the sensor, often a clear cover is applied. However, some embodiments require little if any cover over the sensor, to increase sensor sensitivity. Furthermore, the support structure can be bulky and in turn increase the size of a product design including the sensor.

One embodiment of a low profile sensor can include a sensor disposed on a silicon die. The silicon die, in turn, can be embedded in a printed circuit board (PCB) structure. The low profile sensor can include signal trenches formed in the silicon to allow bond wires to couple to the sensor, while remaining substantially below a surface plane of the sensor. Bond wires can couple the sensor directly to other embedded devices, or to one or more conductive layers in the PCB.

Signal trenches can be formed by removing substrate material such as with a saw or grinder, or signal trenches can be formed by selectively etching the substrate. After forming the signal trench, a conductive material can be deposited into the trench forming a conductive path between a sensor pad and the trench. Finally, a bond wire can be attached to the conductive material and can be used to couple signals from the sensor to external devices or other components.

Figure 1A:
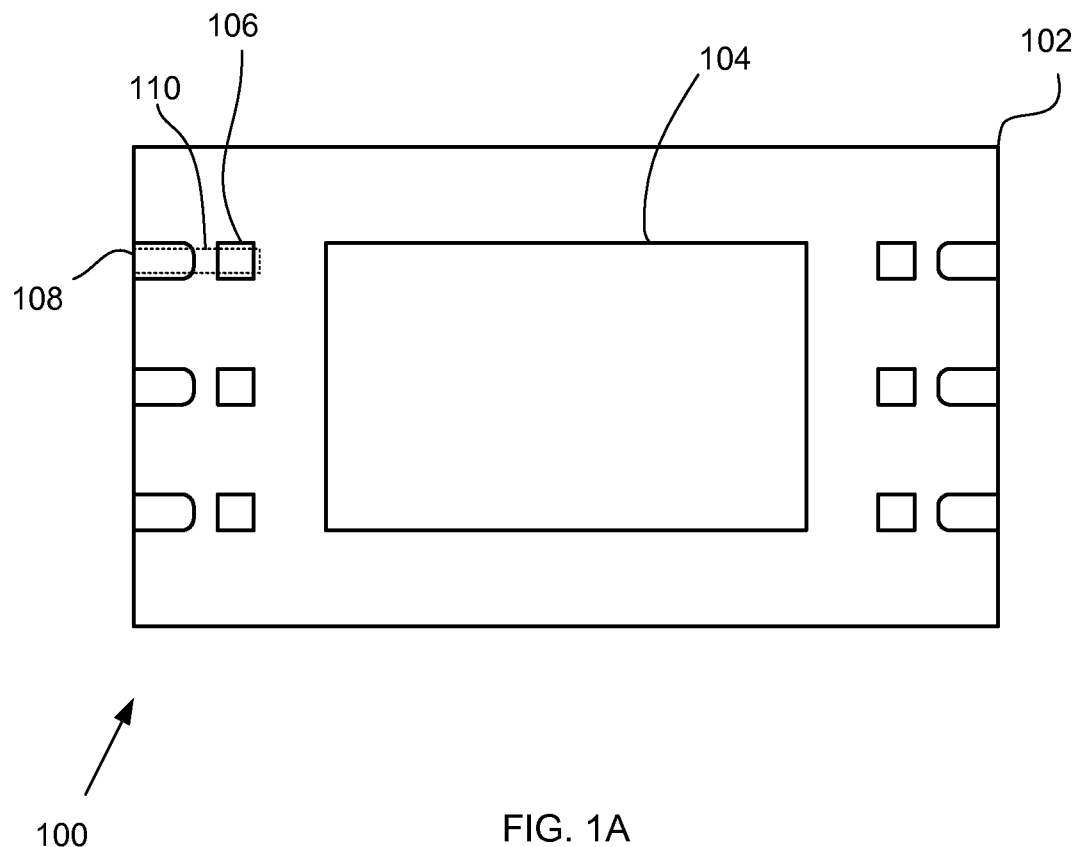
FIGS. 1A and 1B are simplified diagrams of a low profile sensor, in accordance with one embodiment.
Figure 1B:
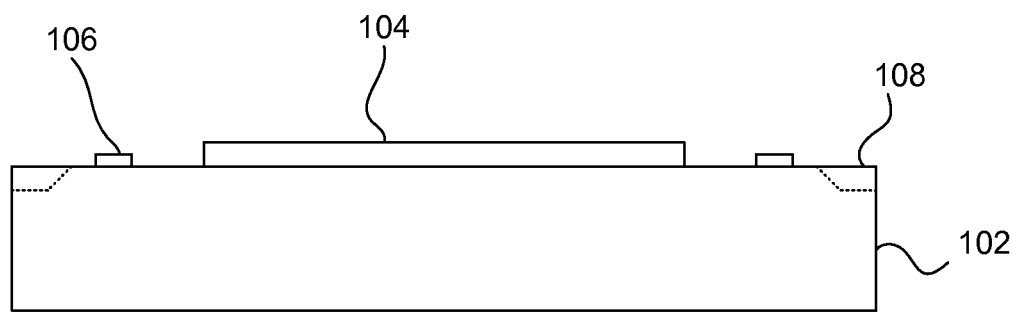

FIGS. 1A and 1B are simplified diagrams of a low profile sensor 100, in accordance with one embodiment of the specification. FIG. 1A shows a top view of the low profile sensor 100. Low profile sensor 100 can include a substrate 102 and a sensor 104 disposed on a first surface of substrate 102. Substrate 102 can be silicon or any other technically feasible material such as gallium arsenide, gallium nitride or the like. Sensor 104 can be a single sensor or an array of sensors. Sensor 104 can be used to detect user input such a touch (pressure), heat or capacitive sensor. In other embodiments, sensor 104 can be any other feasible integrated circuit. Such integrated circuits can be formed on any technically feasible substrate such as silicon, gallium arsenide or the like. In other words, the mounting techniques described herein can be applied equally to any integrated circuit, not only sensors. Throughout this specification, reference will be made to a sensor in the description, but it is understood that any integrated circuit can be substituted for the sensor. Also disposed on the first surface are pads 106 that can be electrically coupled to signals in sensor 104. FIG. 1A also shows a top view of a signal trench 108. A layer of metal 110 (or other conductor) can be deposited in signal trench 108 and couple to pad 106. This is described in greater detail below in conjunction with FIG. 4. FIG. 1B is a side view of low profile sensor 100. This view shows some detail of a possible shape of signal trench 108 within substrate 102. The shape of the signal trench 108 is indicated with dashed lines.

Figure 2A:
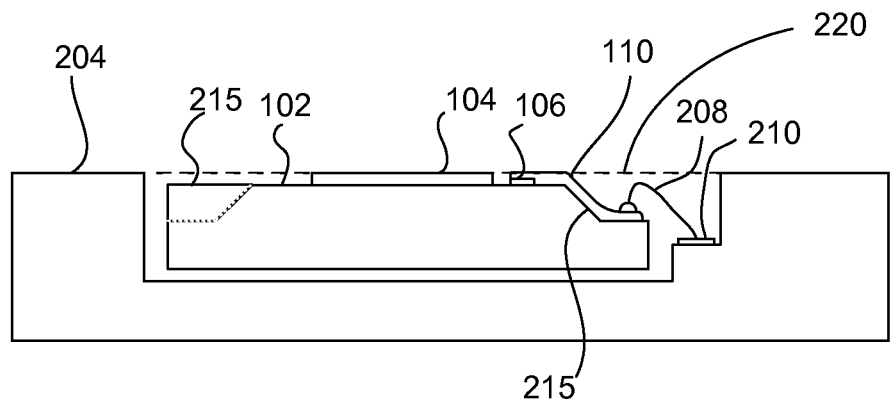
FIGS. 2A-2D illustrate side views of exemplary embodiments of a low profile sensor.
Figure 2A:
Figure 2B:
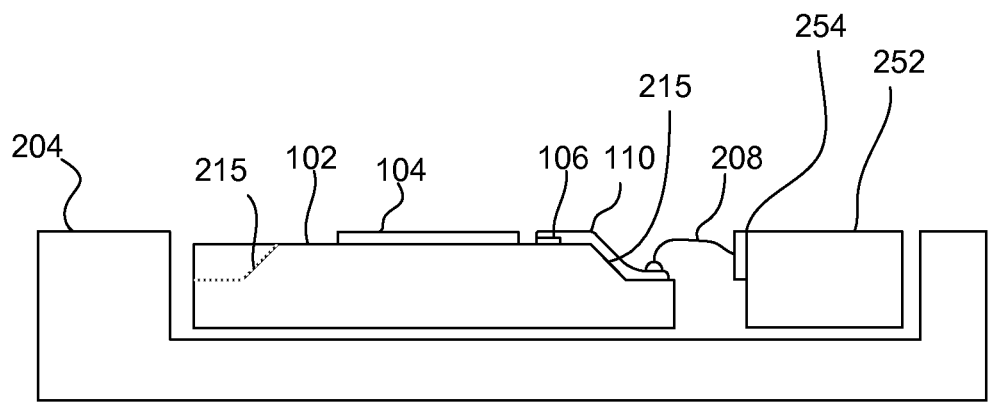
Figure 2B:
Figure 2C:
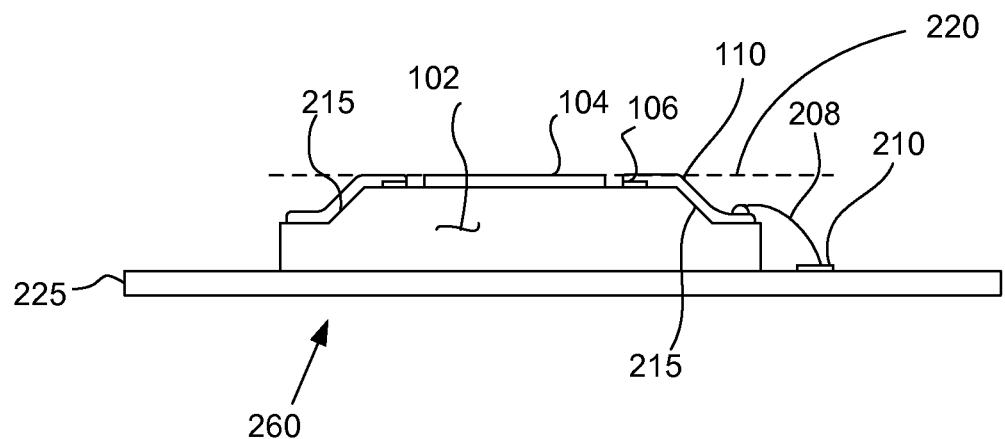
Figure 2D:
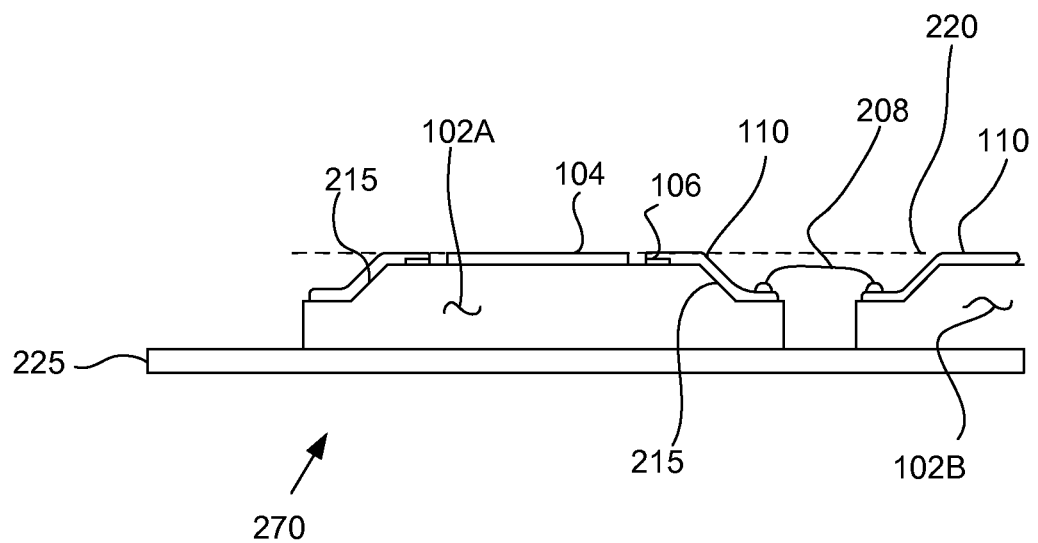

FIGS. 2A-2D illustrate side views of exemplary embodiments of a low profile sensor. FIGS. 2A and 2B shown low profile sensor 100 embedded in a PCB. FIGS. 2C and 2D show low profile sensor 100 mounted on thin substrate, such as a flex circuit. These figures are not drawn to scale, but are meant to show relationships between low profile sensor 100 and PCB or low profile sensor 100 and thin substrate. These figures are not meant to be exhaustive and show every possible configuration, but rather illustrate exemplary approaches. Persons skilled in the art can appreciate that other approaches exist. FIG. 2A illustrates a first bonding approach 200 between substrate 102 and PCB 204. Substrate 102 can include a sensor 104 disposed on a first side. Signal trenches 215 are shown in side view. Metal layer 110 can be formed in signal trenches 215 and can couple to pad 106. Bond wire 208 can couple metal layer 110 to a pad 210 that can be on any layer within PCB 204. Bond wire 208 can be implemented to be below the surface plane 220 of sensor 104. A surface plane can be an imaginary plane that extends in all directions and is co-planar with the highest surface of sensor 104. Surface plane 220 is denoted with a dashed line.

FIG. 2B illustrates a second bonding approach 250 between substrate 102 and PCB 204. Sensor 104 is mounted on substrate 102 and includes pad 106. Signal trenches 215 can be formed in substrate 102 and can include metal layer 110 coupled to pad 106. Substrate 102 and separate device 252 can be embedded together in PCB 204. In some embodiments, two or more separate devices 252 can be embedded in PCB 204. Device 252 can be a separate integrated circuit that can be used to provide additional functionality to sensor 104. For example, device 252 can be a signal processing device used to preprocess signals from sensor 104. Device 252 can include at least one pad 254 to couple to signals within device 252. Bond wire 208 can couple metal layer 110 to device 252. Bond wire 208 can be maintained below surface plane 220.

FIG. 2C illustrates a third bonding approach 260 between substrate 102 and thin substrate 225. In one embodiment, thin substrate 225 can be a flexible circuit (flex circuit). Substrate 102 can be affixed to thin substrate 225 with an adhesive, such as a glue, epoxy or tape adhesive. Sensor 104 can be disposed on substrate 102. Signal trenches 215 can be formed on substrate 102 and can support metal layer 110 over pad 106. A bond wire 208 can couple metal layer 110 to a pad 210. In this embodiment, bond wire 208 can be maintained below surface plane 220.

FIG. 2D illustrates a fourth bonding approach 270 between multiple substrates and thin substrate 225. As shown, a first substrate 102A and a second substrate 102B are affixed to thin substrate 225. Bond wire 208 can be used to couple metal layers 110 from two or more substrates. In FIG. 2D, bond wire 208 can couple signals from first substrate 102A to second substrate 102B. In this manner, two or more substrates 102A, 102B can be linked together.

FIGS. 3A-3D illustrate possible shape profiles for signal trench 215. In one embodiment, the shape profile of the signal trench can affect signal integrity of the signals carried within the signal trenches 215. For example, some common metal deposition techniques (i.e., filament evaporation or electron beam evaporation) can have poor coverage on vertical or near vertical surfaces Other metal deposition techniques can have improved coverage on vertical or near vertical surfaces, but may have other associated costs (i.e., sputter deposition). In other words, certain shape profiles can be preferred over others depending on a selected metal deposition method. Other shape profiles can be possible beyond the exemplary shapes described below.

Figure 3A:
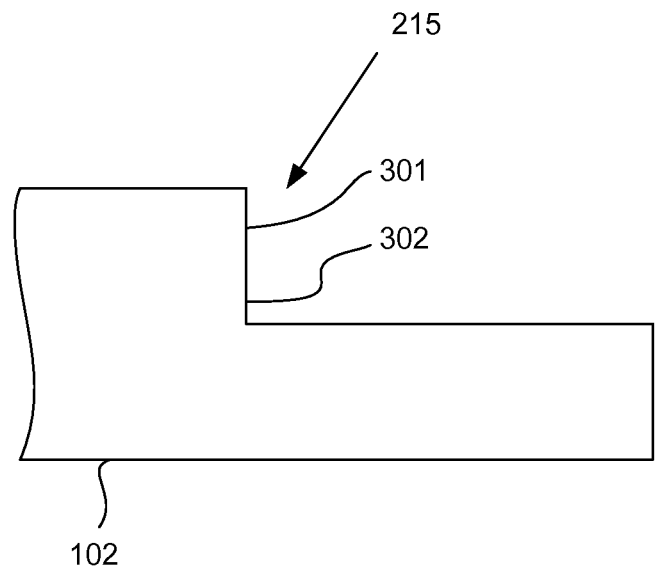
FIGS. 3A-3D illustrate possible shape profiles for signal trenches.

FIG. 3A illustrates a vertical profile 301 for signal trench 215. In this embodiment, signal trench 215 can have a substantially rectilinear profile 301. The rectilinear profile 310 can be formed by many methods, including saw blade and deep reactive ion etch techniques. In some embodiments, two or more shaping methods can be combined to create vertical profile 301. As shown, vertical profile 301 can include at least one substantially vertical section 302. In some embodiments, vertical or near vertical sections may not have relatively even metal coverage. An uneven metal layer can include voids or other irregularities that could result in a discontinuity in the metal.

Figure 3B:
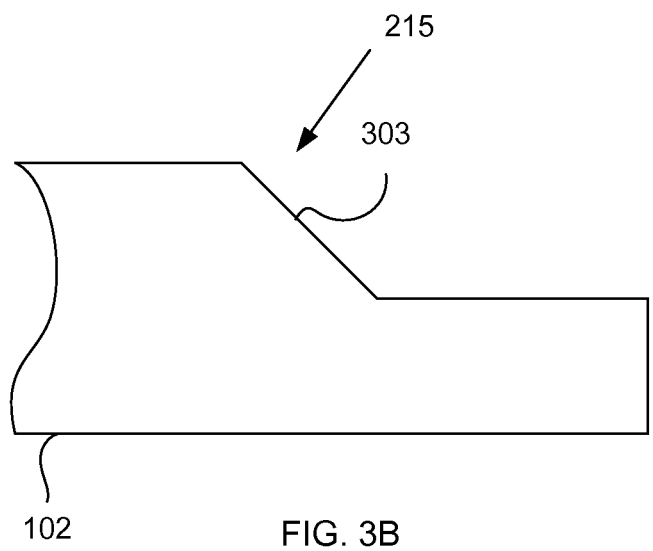

FIG. 3B illustrates a ramp profile 303 for signal trench 215. The ramp profile 303 can be formed a number of ways. In one embodiment a saw blade can be used to form and shape signal trench 215. In another embodiment, ramp profile 303 can be formed, at least in part, by wet etching with potassium hydroxide (KOH). Etching with potassium hydroxide can have the advantage that, by virtue of the reactant, a ramp angle is naturally produced. One advantage of ramp profile 303 is that the profile includes no substantially vertical portions. Thus, the shape of the profile can enable the deposition of relatively even metal layers 110.

Figure 3C:
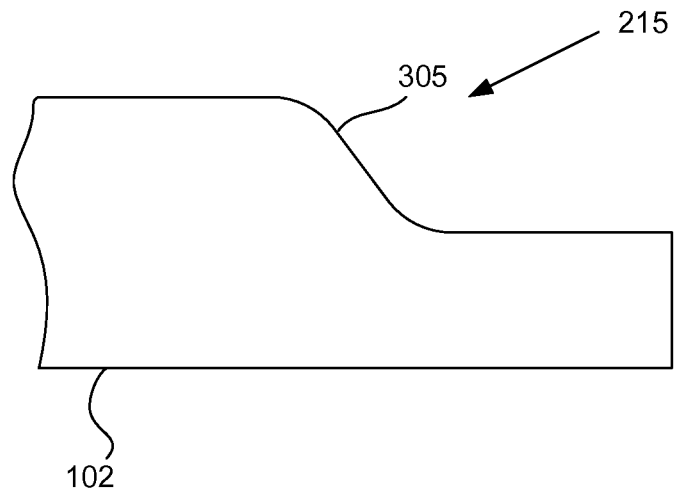

FIG. 3C illustrates an engineered curve profile 305 for signal trench 215. Engineered curve profile 305 can be formed with a shaped saw blade, or by etching. In some embodiments, two or more shaping methods can be combined to create engineered curve profile 305. One advantage of engineered curve profile 305 is that the profile does not include any sharp bends or curves. Sharp bends or curves can become stress points within the substrate 102. These stress points can become starting points for fractures and cracks. Another advantage of engineered curve profile 305 is that the profile does not include any substantially vertical portions, therefore the profile can support the formation of relatively even metal layers.

Figure 3D:
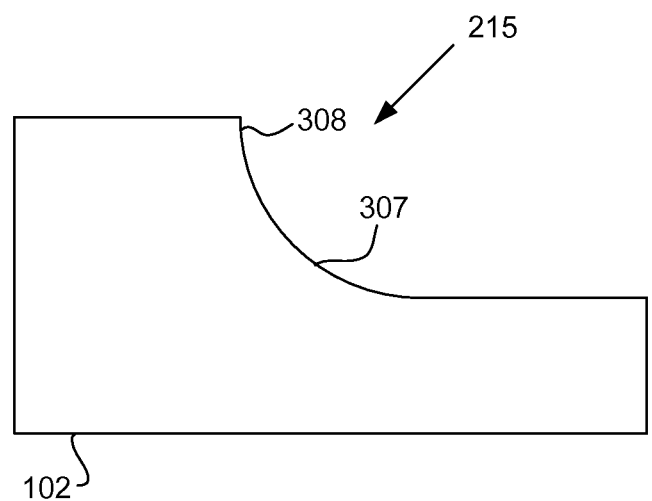

FIG. 3D illustrates a bowl shaped profile 307 for signal trench 215. This profile can be formed with a saw or with etching methods. One advantage of the bowl shaped profile 307 is the inherent strength of the profile. Substrate area near bowl shaped profile 307 can be relatively stronger when compared to areas near other profiles such as rectilinear profile 303. A drawback of the bowl shaped profile 307 it that it can include a relatively vertical region 308. As described above, vertical regions can develop discontinuities and voids when certain metal deposition techniques are used.

Figure 4A:
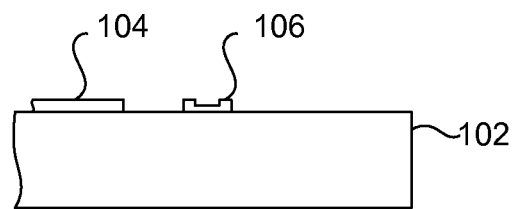
FIGS. 4A-4G illustrate steps that can be used to form a signal trench.
Figure 4B:
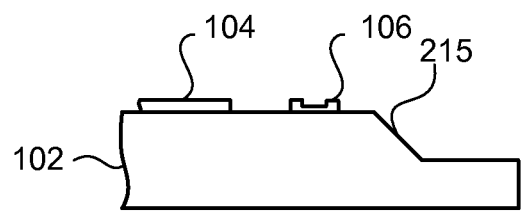
Figure 4C:
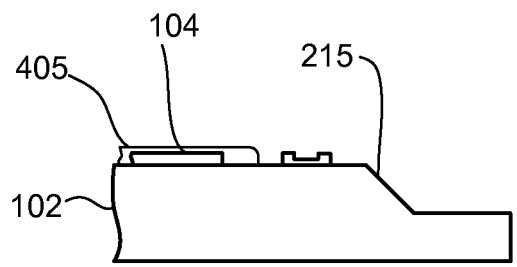

FIGS. 4A-4G illustrate steps that can be used to form signal trench 215. These illustrations are cross sectional views of the trench, with the surrounding areas not drawn to clarify the drawing. FIG. 4A shows a possible beginning state including substrate 102. Pad 106 and sensor 104 are disposed on a first side of substrate 102. FIG. 4B shows substrate 102 with signal trench 215 formed into the substrate 102. Sensor 104 and pad 106 remain on the surface of substrate 102. Signal trench 215 can be formed in the shape of any technically feasible profile. Exemplary profiles are described above in FIGS. 3A-3D. Ramp profile 303 (from FIG. 3B) is selected as the exemplary profile in this figure. Ramp profile 303 can be formed using a potassium hydroxide etch process, for example. FIG. 4C shows a barrier layer 405 deposited on the substrate 102. In one embodiment, barrier layer 405 can be formed with techniques similar to forming passivation layers. In one embodiment, barrier layer 405 can help protect sensor 104.

Figure 4D:
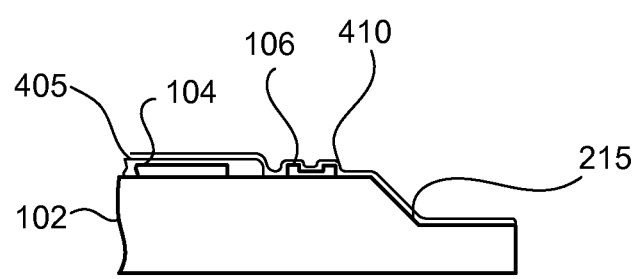
Figure 4E:
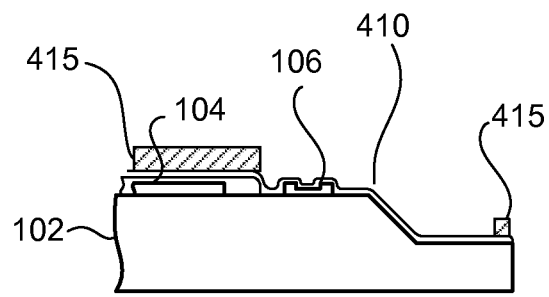
Figure 4F:
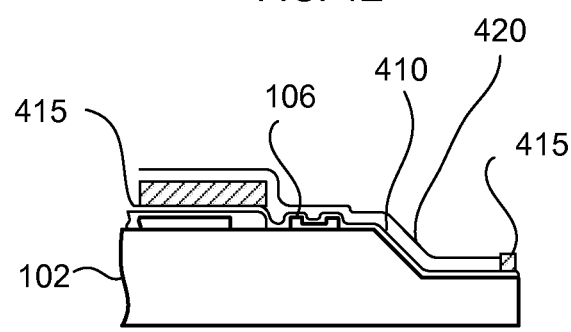
Figure 4G:
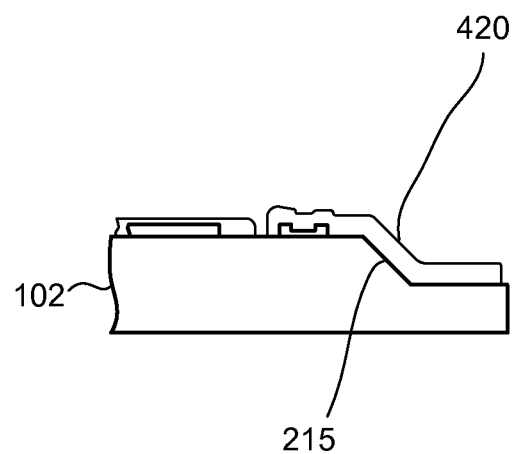

FIG. 4D shows substrate 102, pad 106 and sensor 104. In this view, a metal seed layer 410 has been deposited over the substrate 102, barrier layer 405 and pad 106. As shown, seed layer 410 can be deposited in the regions of the signal trench 215 where a final conductive channel is desired. In one embodiment, seed layer 410 can be deposited by sputtering a conductive metal, such as aluminum. FIG. 4E shows substrate 102, pad 106 and sensor 104 with a mask 415 selectively applied to the first surface. Mask 415 can be used to define regions where additional metal can be deposited over the seed layer 410. In one embodiment mask 415 can be a liquid photoimageable mask. FIG. 4F shows metal 420 deposited over substrate 102, pad 106, seed layer 410 and mask 415. During the metal deposition process, metal can be non-selectively deposited over the entire substrate 102. In FIG. 4G shows substrate 102 after the mask 415 and excess metal seed layer 410 is removed. In one embodiment, metal seed layer 410 can be removed with a wet etch process. Removal of the mask 415 and metal seed layer 410 can define the final shape of the metal layer 420 in signal trench 215.

Figure 5:
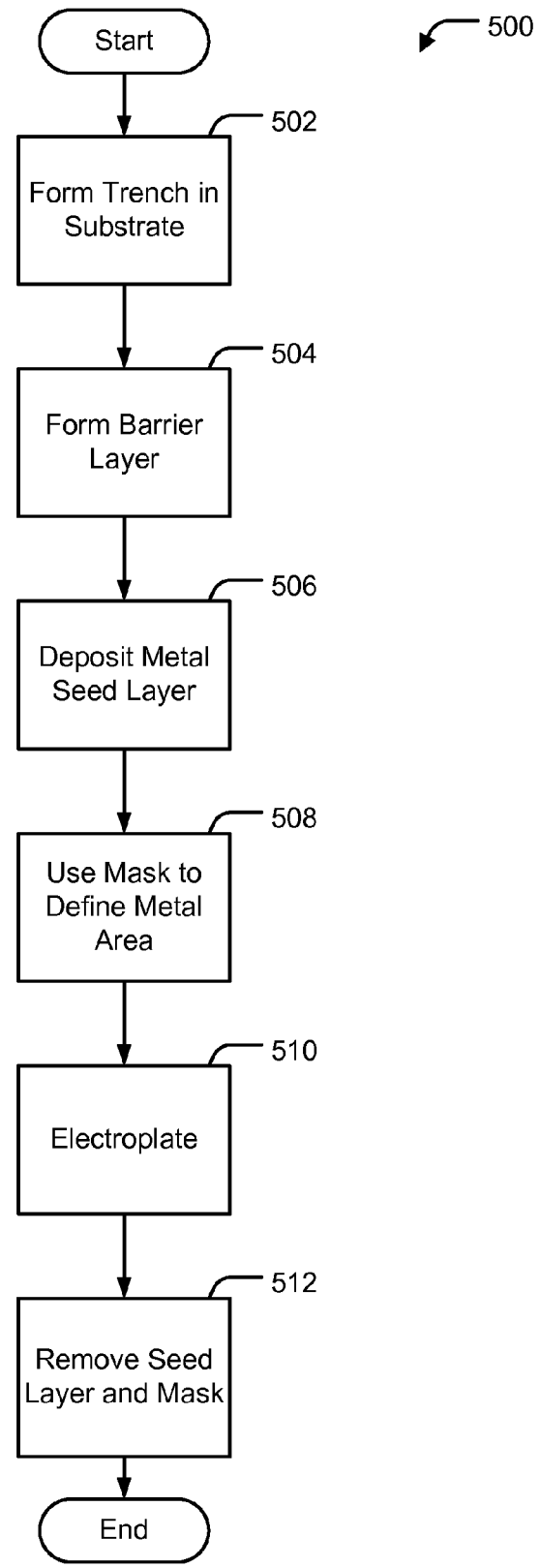
FIG. 5 is a flow chart of method steps for forming signal trenches in a substrate.

FIG. 5 is a flow chart 500 of method steps for forming signal trenches in a substrate. The method begins in step 502 where the trench profile is formed in the substrate. The trench profile can be selected from one of the profiles described in FIGS. 3A-3D, or any other technically feasible profile. In step 504, a barrier layer can be formed and deposited over the substrate. The barrier layer can help protect the substrate after trenches are formed in substrate. In step 506, a seed layer of metal can be deposited in the formed trench and can couple to the pad. In step 508, a mask can be selectively placed on the substrate. In one embodiment, the mask can be a liquid photoimageable mask. The mask can be used to determine the areas on the substrate where the metal within the signal trench will be positioned. In step 510, additional metal can be deposited over the substrate. In one embodiment, metal can be sputtered. In step 512, the mask and excess seed layer can be removed, forming the final conductive layer in the signal trench and the method ends.

Formation of the signal trenches can provide access to signals from the sensor while maintaining connections below the surface plane of the sensor. In order to fan out the signals to other devices, wires can be bonded to the metal deposited in the signal trenches. After a wire is bonded, the wire can be routed to a pad or other conductor. Care can be taken to maintain the path of the wire to be below the surface plane of the sensor, thereby allowing a low profile mounting of the sensor and substrate. In one embodiment, a bond wire can be formed by depositing a wire bond ball in the signal trench on the metal layer. The bond wire can be guided within the signal trench.

Figure 6:
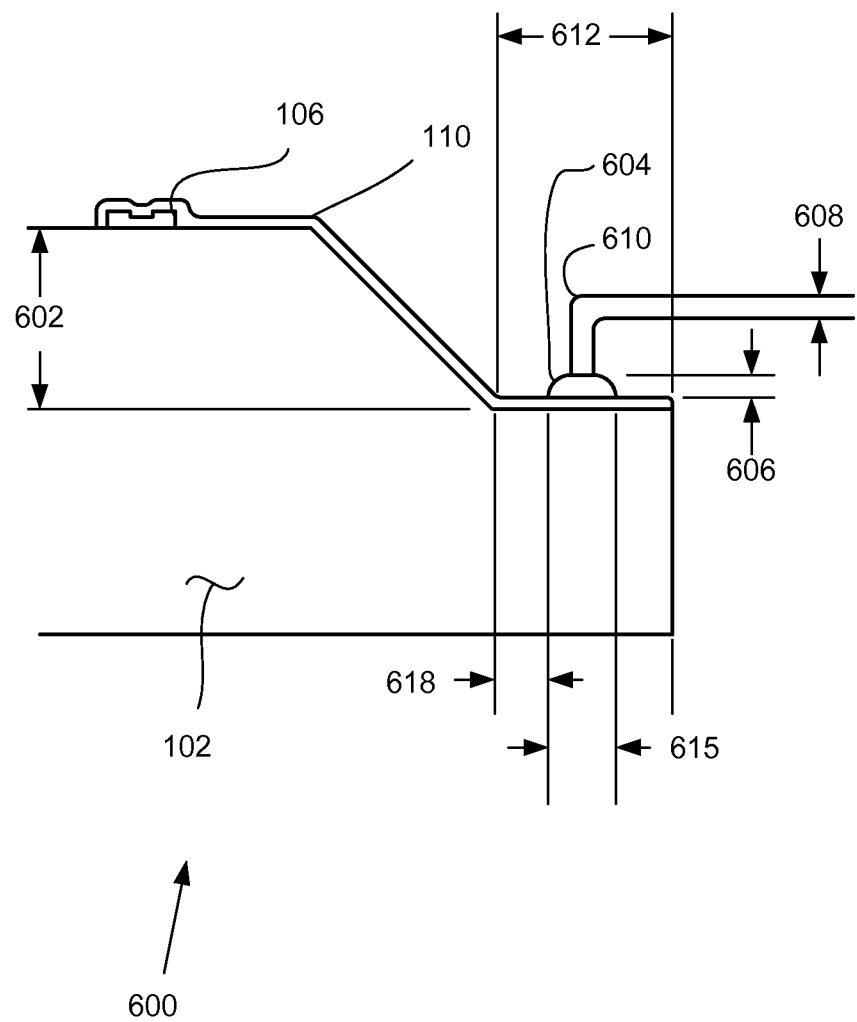
FIG. 6 is a side view of signal trench, in accordance with one embodiment of the specification.

FIG. 6 is a side view 600 of signal trench 215, in accordance with one embodiment of the specification. The side view 600 includes substrate 102, pad 106 and metal layer 110. Depth 602 of signal trench 205 can be a function of the elements that can be included within signal trench 215. Wire bond ball 604 can be bonded to metal layer 110 in the bottom of signal trench 215. The height 606 of wire bond ball 604 can vary. Common heights can range from 5-15 μm. Diameter 608 of wire can vary by application; current carrying wires (power) can be thicker than wires only carrying signals. A typical wire diameter 608 can be 25 μm. Finally, bend radius 610 can affect the depth 602. In one embodiment depth 602 can be determined, at least in part by the sum of the wire bond ball height 606 plus wire diameter 608 plus bend radius 610.

The width 612 of the bottom of signal trench 215 can be determined, at least in part, by elements that are included in the bottom of the signal trench 215. A typical diameter 615 of wire bond ball 604 can be 50 μm. The distance 617 from the wire bond ball to the edge of the substrate 102 can be 20 μm. This distance can be reduced, however, since edge chipping can occur, yield of the device can be reduced if the distance is reduced too much. The distance 618 from the wire bond ball to the inside edge of the bottom of signal trench 15 can be between 5 to 10 μm. In some embodiments, the distance 618 can be influenced by a tool used for wire bonding. Thus, in one embodiment, width 612 can be determined, at least in part, by the sum of wire bond ball diameter 615, plus distance to substrate edge 617 plus distance to inside edge 618.

Figure 7:
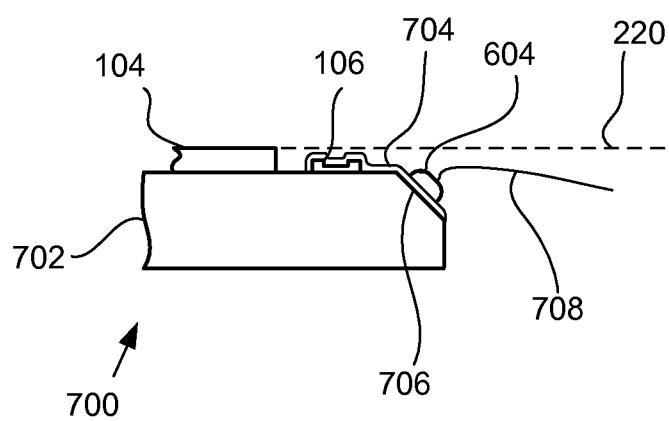
FIG. 7 shows another embodiment of a low profile sensor.

FIG. 7 shows another embodiment of a low profile sensor 700. In this embodiment, the signal trenches can be replaced by shaped features disposed on the edge of the substrate. Substrate 702 includes pad 106 disposed on a first side of substrate 702. Shaped feature 706 can be formed on one corner of substrate 702. Metal layer 704 can be disposed on pad 106 and can also be disposed on shaped feature 706. Wire bond ball 604 can be positioned on shaped feature 706 such that wire 708 can be maintained below surface plane 220 of sensor 104.

Figure 8:
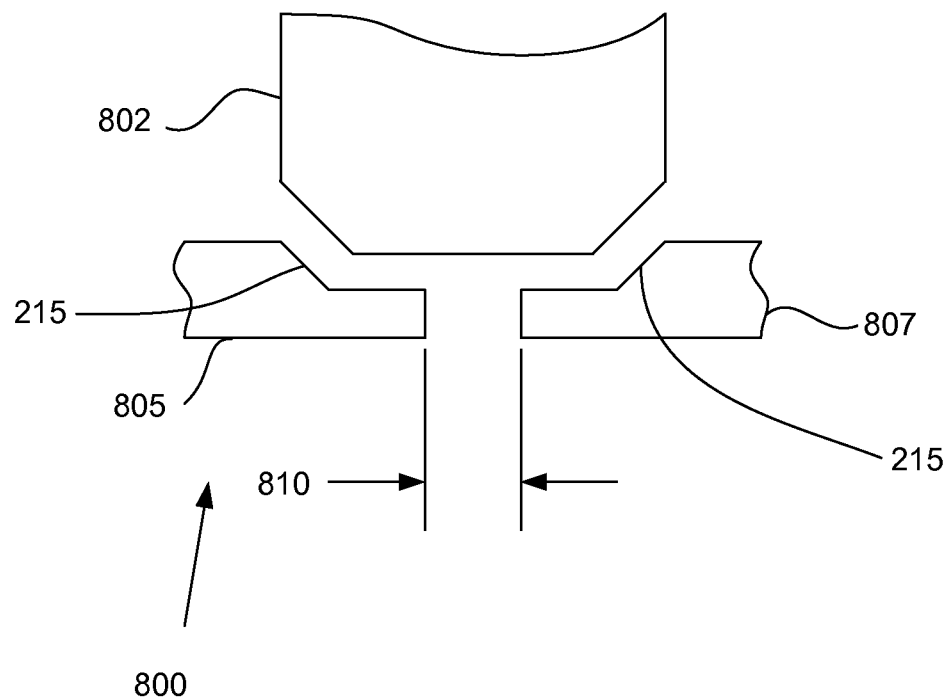
FIG. 8 shows a side view of one embodiment of a way of forming multiple low profile sensors.

FIG. 8 shows a side view 800 of one embodiment of a way of forming multiple low profile sensors. Multiple low profile sensors can be formed on a silicon wafer with each individual low profile sensor formed on an individual die on the wafer. Prior to separating the individual dice, a grinding wheel 802 or shaped saw blade can form signal trenches 215 across two or more dice, with a relatively continuous grind or cut. In the example shown in FIG. 8, grinding wheel 802 can form signal trenches 215 in first and second low profile sensors 805 and 807 respectively. In a later operation, a saw can separate the dice forming a saw cut 810.

Figure 9:
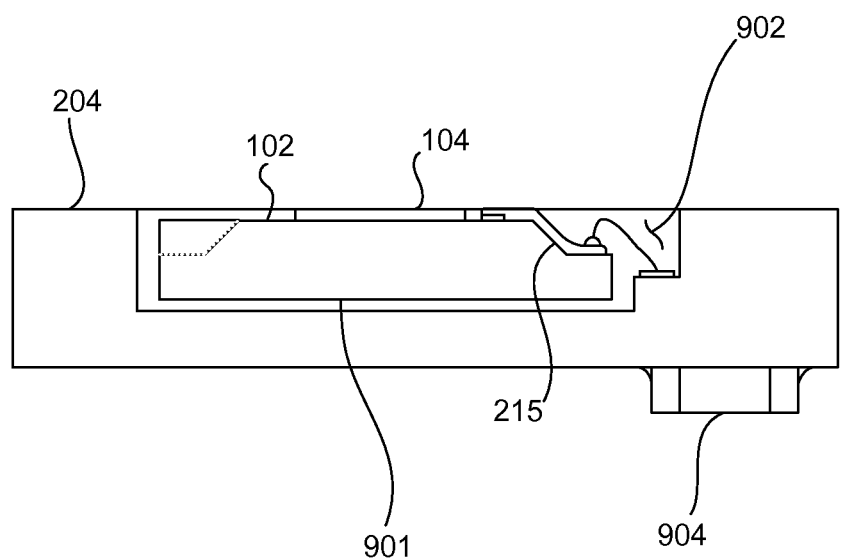
FIG. 9 illustrates optional features that can be applied to a low profile sensor assembly embedded in a PCB.

FIG. 9 illustrates optional features that can be applied to a low profile sensor assembly 901 embedded in a PCB 204. The low profile sensor assembly 901 can include sensor 104 and substrate 102. After the low profile sensor assembly 901 is embedded in PCB 204, empty voids 902, especially in the areas of signal trench 215, can be filled with an epoxy, resin or other like material to strengthen the bond between low profile sensor assembly 901 and PCB 204 and form a relatively planar surface. In another embodiment, components 904 can be disposed on PCB 204, on the side facing away from sensor 104. Components 904 can be passive components such as resistors, inductors, capacitors or the like. Components 904 can be coupled to sensor 104 or other devices.

Figure 10A:
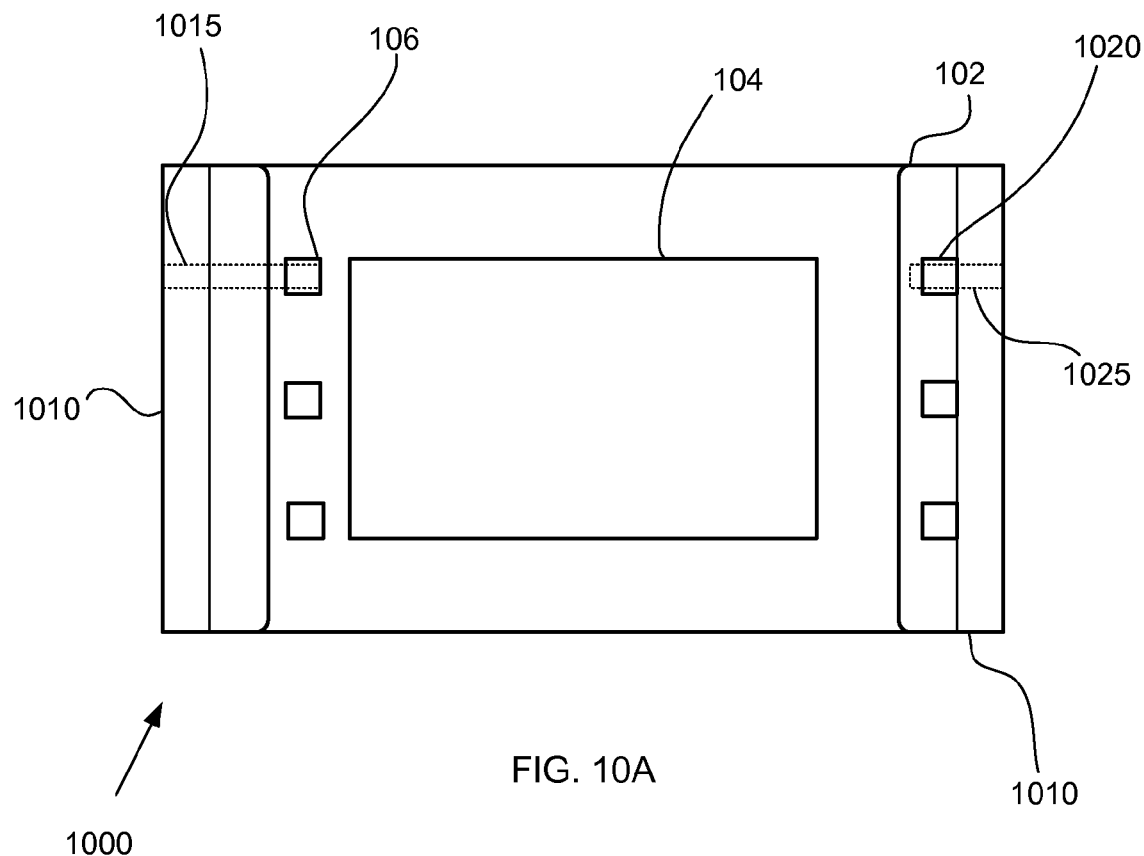
FIGS. 10A and 10B illustrate another embodiment of a low profile sensor.
Figure 10B:
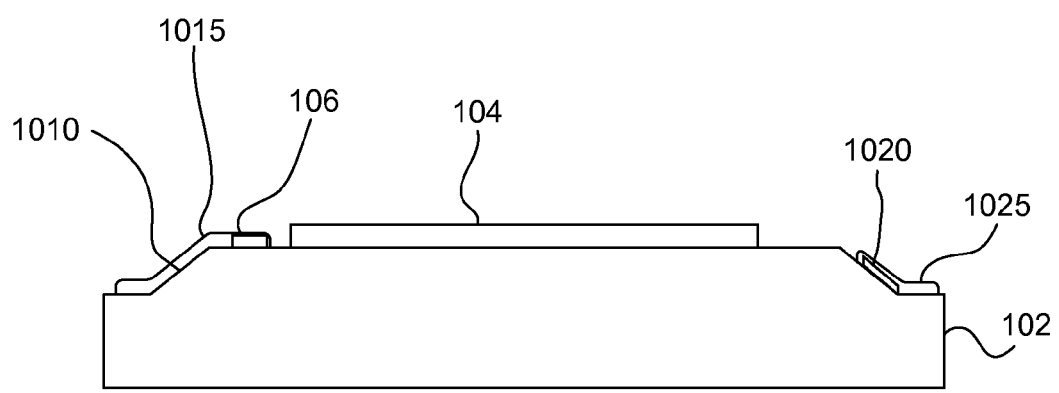

FIGS. 10A and 10B illustrate another embodiment of a low profile sensor 1000. In this embodiment, individual signal trenches can be replaced with a single trench 1010 that can be formed on edge of substrate 102. Sensor 104 can be disposed on one surface of substrate 102. Pad 106 can be disposed on the same planar surface as sensor 104. Metal layer 1015 can couple pad 106 to at least one region of single trench 1010. In another embodiment, pads can be positioned within single trench 1010 region as shown with pad 1020. Metal layer 1025 can be deposited over pad 1020 and be positioned in single trench 1010. FIG. 10B shows a side view of low profile sensor 1000. Metal layer 1015 can be deposited on pad 106 and into single trench 1010. In another embodiment, pad 1020 can be positioned in single trench 1010. Metal layer 1025 can be deposited on pad 1020 and into single trench 1010.

Figure 11A:
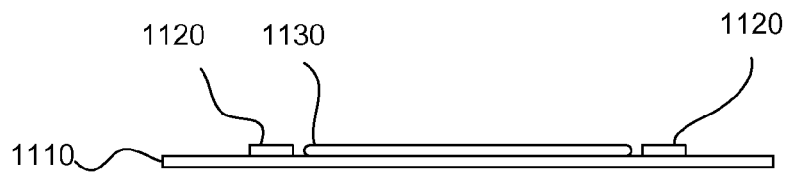
FIGS. 11A-11E illustrate steps that can be used to mount a low profile sensor on a substrate.
Figure 11B:
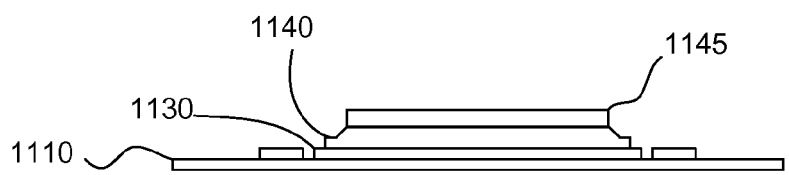
Figure 11C:
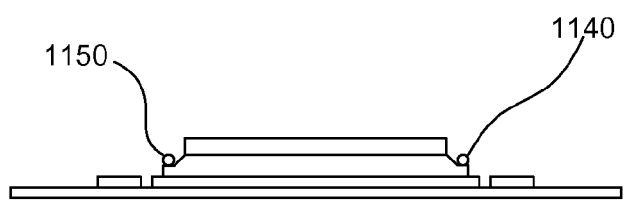
Figure 11D:
Figure 11E:
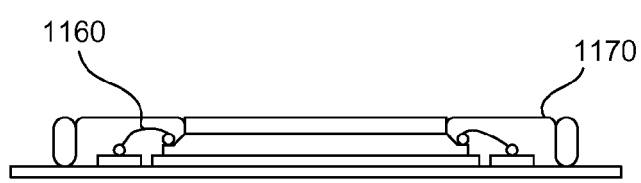

FIGS. 11A-11E illustrate steps that can be used to mount a low profile sensor on a substrate. In one embodiment, the substrate can be a thin substrate 1110, such as a flexible cable. FIG. 11A shows an initial state of thin substrate 1110 and pads 1120. Adhesive 1130 can be deposited on thin substrate 1110. Adhesive 1130 can be an epoxy, glue, adhesive tape or other similar article. In FIG. 11B, substrate 1140 including sensor 1145 can be positioned on adhesive 1130. In FIG. 11C, wire bond balls 1150 can be attached to substrate 1140 in preparation for bond wire attachment. In FIG. 11D, bond wires 1160 can be attached to wire bond balls 1150 and can couple signals from sensor 1145 to pad 1120. In one embodiment, optional wire bond balls 1165 can be coupled to pad 1120. In FIG. 11E bond wires 1160 can be encapsulated to protect them in an epoxy 1170, resin or similar material.

Figure 12:
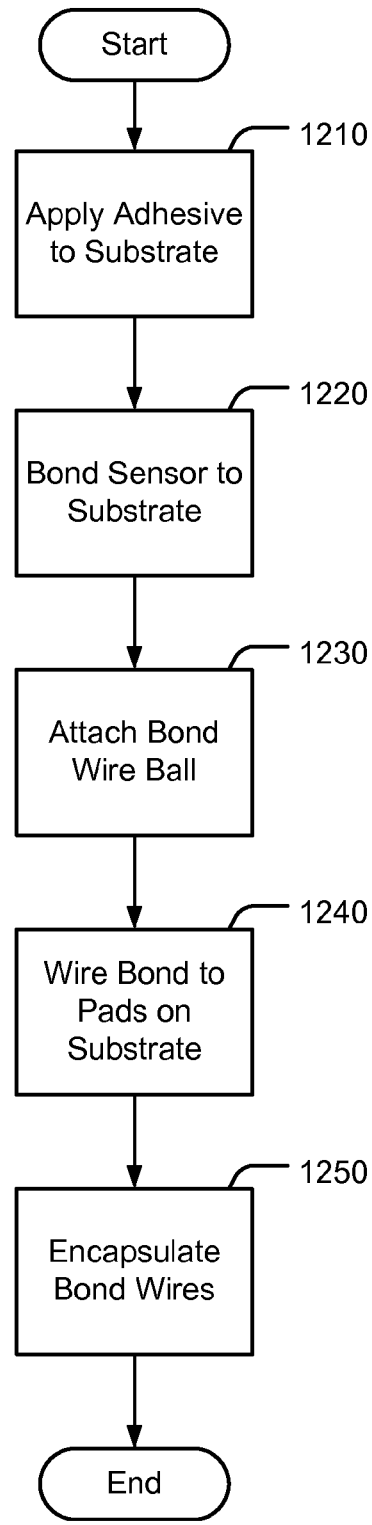
FIG. 12 is a flow chart of method steps for mounting a low profile sensor on a substrate.

FIG. 12 is a flow chart of method steps for mounting a low profile sensor on a substrate. In one embodiment, the substrate can be a thin substrate such as a flexible circuit. The method begins in step 1210 where an adhesive is applied to a substrate. The adhesive can be a liquid adhesive such as an epoxy or can be a tape based adhesive. In step 1220, the sensor/substrate combination can be bonded to the substrate. In step 1230, bond wire balls can be attached to the substrate. In one embodiment, the bond wire balls can be coupled to metal layers on the substrate enabling access to the signals in the sensor. In step 1240, bond wires can be attached to bond wire balls and pads disposed on the substrate. In step 1250, bond wires can be encapsulated. Encapsulation can help protect fragile bond wires from damage.

Figure 13:
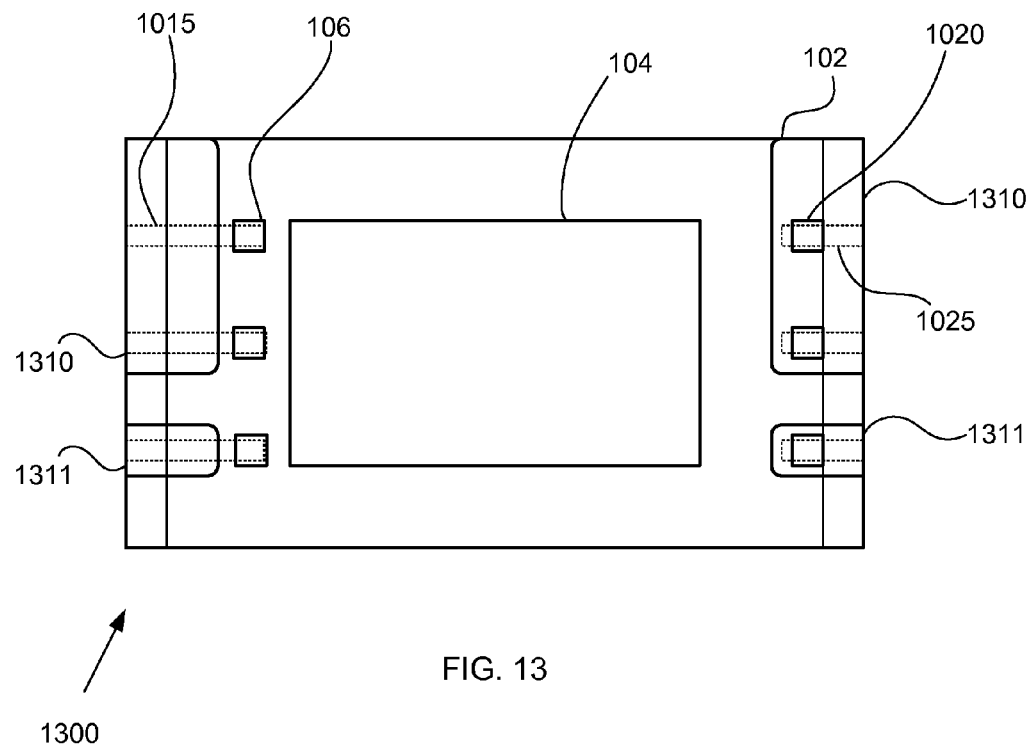
FIG. 13 is a top view of yet another embodiment of a low profile sensor.

FIG. 13 is a top view of yet another embodiment of a low profile sensor 1300. This embodiment can include both individual single trenches as described in FIG. 1 and multiple signal trenches that can include more than one signal as described in FIG. 10. Low profile sensor 1300 can include substrate 102 and sensor 104. Pads 106 can be disposed outside of a trench. For example, pad 106 is disposed beyond multiple signal trench 1310 and beyond single signal trench 1311. In another embodiment, the pad can be disposed inside the trench region. For example, pad 1020 can be disposed within multiple signal trench 1310 or within single trench 1311. Metal layers 1015 can couple to pads 106 beyond signal trenches 1310 and 1311. Alternatively, metal layers 1025 can couple to pads 1020 within signal trenches 1310 and 1311. In some embodiments, multiple signal trenches 1310 can provide greater signal densities, while in some embodiments, single signal trenches 1311 can provide greater strength to substrate 102. Low profile sensor 1300 can possess advantages of both the signal and multiple signal trench systems.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

What is claimed is:

1. A method of forming a low profile assembly, comprising:
    forming a signal trench in a substrate;
    depositing a barrier layer over the substrate proximate the signal trench;
    depositing a seed layer of metal in the signal trench;
    depositing a masking layer over the substrate, the barrier layer, and the signal trench;
    depositing an additional metal over the masking layer; and
    removing the masking layer and the seed layer to form a final conductive layer in the signal trench.

2. The method of claim 1, wherein the barrier layer is configured to protect areas of the substrate proximate the signal trench.

3. The method of claim 1, wherein depositing the masking layer comprises applying a liquid photoimageable mask over the substrate, the barrier layer, and the signal trench.

4. The method of claim 3, wherein the applying the liquid photoimageable mask defines areas on the substrate where the seed layer of metal within the signal trench is positioned.

5. The method of claim 4, wherein the depositing the additional metal comprises sputtering metal on the defined areas.

6. The method of claim 1, further comprising depositing a wire bond ball on the seed layer of metal within the signal trench.

7. The method of claim 6, wherein the wire bond ball and a bond wire connected to the wire bond ball are below a surface plane extending in a horizontal direction from a top surface of the substrate.

8. The method of claim 7, further comprising electrically connecting a component coupled with the substrate to a separate device via the bond wire.

9. The method of claim 8, wherein the separate device includes a pad electrically coupled to the component via the bond wire.

10. The method of claim 1, further comprising a sensor coupled with the substrate.

11. The method of claim 1, wherein the signal trench comprises a substantially vertical portion perpendicular to a substantially horizontal portion of the substrate.

12. The method of claim 1, wherein the signal trench comprises a ramp profile that includes a diagonal portion.

13. The method of claim 1, wherein the signal trench comprises a curved profile that includes a non-linear portion.

14. A method of forming a low profile assembly, comprising:
    forming a signal trench on a first side of a substrate proximate to an integrated circuit signal pad, the signal trench extending to an edge of the substrate;
    depositing a barrier layer over the substrate and the integrated circuit signal pad;
    depositing a first layer of metal over the integrated circuit signal pad, the barrier layer, and the signal trench;
    depositing a masking layer over only a location of the first layer of metal associated with the integrated circuit signal pad; and
    depositing a second layer of metal over the masking layer, the first layer of metal, and the signal trench.

15. The method of claim 14, further comprising:
    subsequent to the depositing a masking over only a location of the first layer of metal associated with the integrated circuit signal pad, removing the masking layer and the first layer of metal to form a final conductive layer in the signal trench.

16. The method of claim 15, further comprising positioning a wire bond ball in the signal trench.

17. The method of claim 15, wherein the signal trench comprises a substantially vertical portion perpendicular to a substantially horizontal portion of the substrate.

18. The method of claim 15, wherein the signal trench comprises a ramp profile that includes a diagonal portion.

19. The method of claim 15, wherein the signal trench comprises a curved profile that includes a non-linear portion.

20. The method of claim 16, further comprising coupling a bond wire with the wire bond ball.

21. The method of claim 20, wherein the wire bond ball and the bond wire are below a surface plane of an integrated circuit positioned on a top surface of the substrate.

* * * * *